United States Patent [19]

Stein

[11] 4,290,120

[45] Sep. 15, 1981

[54] CIRCUIT ARRANGEMENT FOR READING OUT AND REGENERATING ITEMS OF INFORMATION STORED IN ONE-TRANSISTOR STORAGE ELEMENTS

[75] Inventor: Karl U. Stein, Munich, Fed. Rep. of Germany

[73] Assignee: Siemens Aktiengesellschaft, Berlin & Munich, Fed. Rep. of Germany

[21] Appl. No.: 69,175

[22] Filed: Aug. 23, 1979

[30] Foreign Application Priority Data

Sep. 29, 1978 [DE] Fed. Rep. of Germany ....... 2842547

[51] Int. Cl.³ .............................................. G11C 7/00
[52] U.S. Cl. .................................... 365/205; 365/222
[58] Field of Search ......................... 365/205, 207, 222

[56] References Cited

U.S. PATENT DOCUMENTS 4,160,275 7/1979 Lee et al. ............................ 365/205

FOREIGN PATENT DOCUMENTS 2309192 8/1975 Fed. Rep. of Germany .

OTHER PUBLICATIONS

Heller et al., "High-Sensitivity Charge-Transfer Sense Amplifier", 1975 IEEE International Solid-State Cir. Conf., 2/13/75, pp. 112–113.
Hoffmann, "Continuously Charge-Coupled Random-Access Memory (CCC RAM)", 1976 IEEE International Solid-State Cir. Conf., 2/19/76, pp. 130–131.
Tasch et al., "The Charge-Coupled RAM Cell Concept," IEEE Trans. on Electron Devices, vol. Ed. 23, No. 2, Feb. 1976, pp. 126–131.
Karte, "Cache Memory," *Elektronik*, 1974, p. 12.

*Primary Examiner*—Stuart N. Hecker
*Attorney, Agent, or Firm*—Hill, Van Santen, Steadman, Chiara & Simpson

[57] ABSTRACT

A circuit arrangement is disclosed for reading out and regenerating items of information stored in one-transistor storage elements. For read-out, storage elements addressed by the activation of a word line transfer an existing information charge into assigned bit lines, and wherein the bit lines influence inputs of assigned read-out/regenerating amplifiers. The storage density of semiconductor stores is increased by providing a circuit arrangement in which the disproportion in terms of area between technologically realizable storage matrices and the required amplifiers which is a by-product of the miniaturization of stores of the above mentioned type does not occur. A group of m bit lines are in each case combined to form groups and are consecutively connected via a multiplexer to a common read-out/-regenerating amplifier.

2 Claims, 2 Drawing Figures

CIRCUIT ARRANGEMENT FOR READING OUT AND REGENERATING ITEMS OF INFORMATION STORED IN ONE-TRANSISTOR STORAGE ELEMENTS

BACKGROUND OF THE INVENTION

The invention relates to a circuit arrangement for reading out and regenerating items of information stored in one-transistor storage or memory elements. For read-out, storage elements addressed by the activation of a word line transfer an existing information charge into bit lines to which they are assigned, and wherein the bit lines influence inputs of read-out/regenerating amplifiers to which they are assigned.

Currently the most important problem in the field of storage development consists in increasing the storage density of semiconductor memorys. Previously the storage density was fundamentally determined by the sensitivity of the read-out/regenerating amplifiers, the charge transfer via the bit lines (governed by the ratio of storage cell capacity to bit line capacity), and the dimensions of the amplifier. In particular in order to improve the charge transfer, arrangements are known (see for example arrangements comprising threshold transistors, such as German Patent No. 23 09 192 and L. G. Heller et al: High Sensitivity Charge Transfer Sense Amplifier, Digest of Technical Papers 1975, IEEE International Solid-State Circuits Conference, page 112 (both incorporated herein by reference)). Charge transfer arrangements also are known comprising a resistance gate, such as K. Hoffmann: Continuously Charge-Coupled Random Access Memory, Digest of Technical Papers 1976, IEEE International Solid-State Circuits Conference, page 130 (incorporated herein by reference). A series of proposals for increasing the amplifier sensitivity have also been made.

By means of improvements of the above mentioned type, on the basis of the signal amplitude it is fundamentally possible to reduce the dimensions of one-transistor storage elements and allied arrangements—see for example A. F. Tasch et al: The Charge-Coupled RAM Cell, IEEE Transactions on Electron Devices, vol. Ed. 23, No. 2, February 1976, pages 126 (incorporated herein by reference)—to the minimum which is technologically possible. However, the minimum spacing from bit line to bit line accordingly becomes smaller than the corresponding dimension of the amplifier.

SUMMARY OF THE INVENTION

An object of the invention is to provide a circuit arrangement in which the disproportion between the area of technologically realizable storage matrices and their required amplifiers, which has been a by-product of the miniaturization of stores of the above mentioned type, does not occur.

According to the invention, a circuit arrangement is provided for reading out and regenerating items of information stored in one-transistor storage elements. For read-out, storage elements addressed by the activation of a word line transfer an existing information charge into assigned bit lines. The bit lines influence inputs of assigned read-out/regenerating amplifiers. A group of m bit lines are in each case combined to form bit line groups. The bit line groups are assigned multiplexers which are known. The individual bit lines of a bit line group are connected to individual inputs of the assigned multiplexer. The multiplexers are each connected by one output to the input of an assigned read-out/regenerating amplifier. A multiplex decoder is provided by means of which all the individual bit lines within each bit line group can be consecutively connected in a given sequence via the relevant multiplexer to the input of the assigned read-out/regenerating amplifier.

With the invention no individual bit-line read-out/regenerating amplifiers are required, as a result of which the proportion of space occupied by these amplifiers in relation to the overall area requirements can be decisively reduced.

In a further development of the invention, in order to improve the transfer of charge into the bit lines, threshold transistors are interposed which are known both per se and with respect to their arrangement. The threshold transistors are connected in pairs by their gates to the relevant outputs of the multiplex decoder so that the threshold transistors serve as elements which switch individual inputs of a multiplexer. For each output of the multiplex decoder a load element is provided whose second terminal is in each case connected to a threshold potential.

The further development of the invention offers the advantage that the high density of bit lines which can be attained may be exploited and moreover the advantages of threshold transistors which are described in the above mentioned publications, i.e. full transmission of the charge to the amplifier input, can likewise be exploited.

In another development of the invention, in order to reduce idle periods of the overall storage arrangement which occur since the bit lines are read out in cyclic fashion by means of multiplexers, a cache memory or store known per se is provided. The cache memory is arranged on the same chip as the storage arrangement. The cache memory stores not only the current bits, but also all adjacent bits which are affected by the same read-out cycle of a multiplexer so that they are available for succeeding access with the shortest possible access time.

In electronic data processing a cache memory is understood as a relatively small additional memory (having a capacity e.g. of 2 K words) of high speed which is generally designed as a semiconductor memory and which cooperates with a main memory in order to shorten the cycle time of the computer, see e.g. ELEKTRONIK 1974, vol. 12, Lexicon card, incorporated by reference.

DESCRIPTION OF THE PREFERRED EMBODIMENTS

Figure 1:
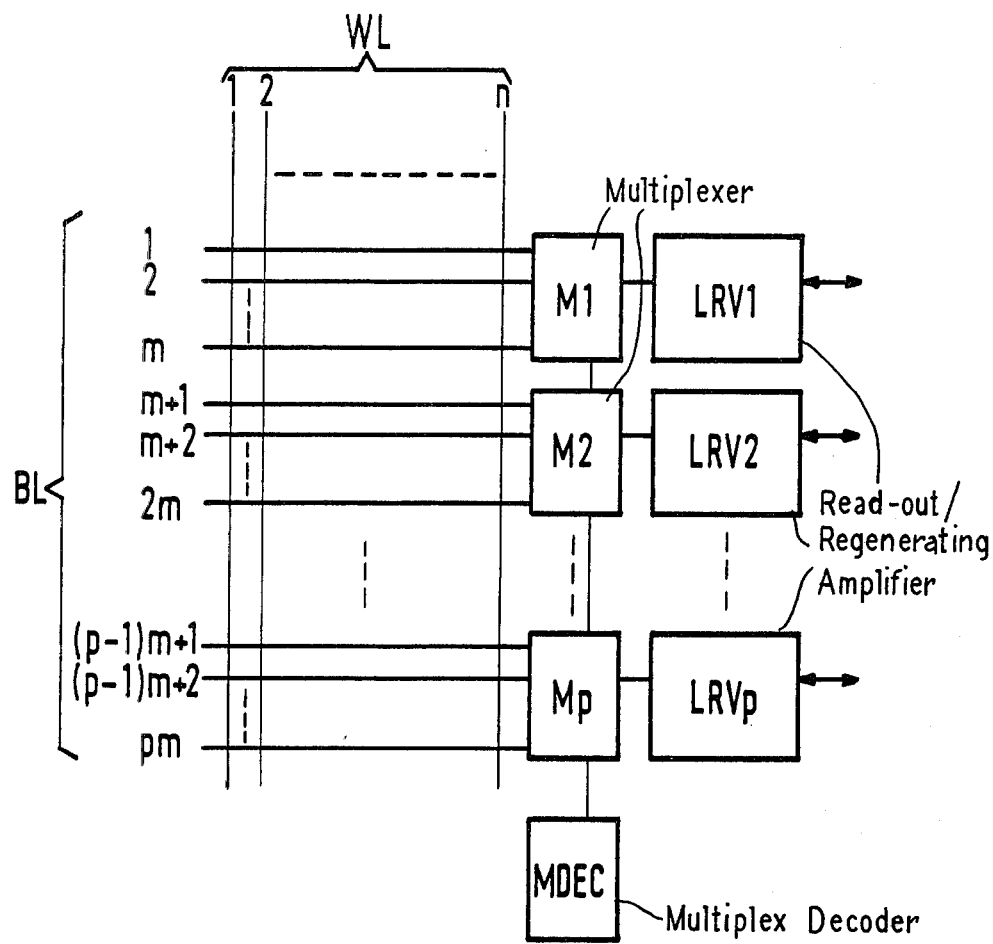
FIG. 1 illustrates the fundamental arrangement of a memory operating in multiplex fashion of a read-out/regenerating amplifier for in each case m bit lines.

As already mentioned, FIG. 1 illustrates the fundamental arrangement of a memory operating in multiplex fashion of a read-out/regenerating amplifier for in each case m bit lines. These bit lines are divided into p bit line groups 1, 2 ... m; m+1, m+2 ... 2m; (p−1) m+1, (p−1) m+2 ... pm. All the bit lines of a bit line group are connected to individual inputs of a multiplexer which is permanently assigned to the relevant bit line group, e.g. M1 for the bit lines 1, 2 . . . m. One output of a multiplexer e.g. M1, is connected to the input of the read-out/regenerating amplifier LRV1 to which it is permanently assigned. All p multiplexers M1, M2 . . . Mp can be driven by a centrally arranged multiplex decoder MDEC. Under the control of the multiplex decoder MDEC, the m bit lines of a bit line group, e.g. 1, 2 . . . m, are consecutively connected in a given sequence to the input of the assigned amplifier by means of the assigned multiplexer M1. The mode of operation of a multiplexer is known per se. Because of the arrangement of the multiplexer, the individual bit-line read-out/regenerating amplifiers are no longer required so that advantageously the disproportion in terms of area between the densely packed bit lines and the amplifiers which each require a minimum area, is eliminated.

Figure 2:
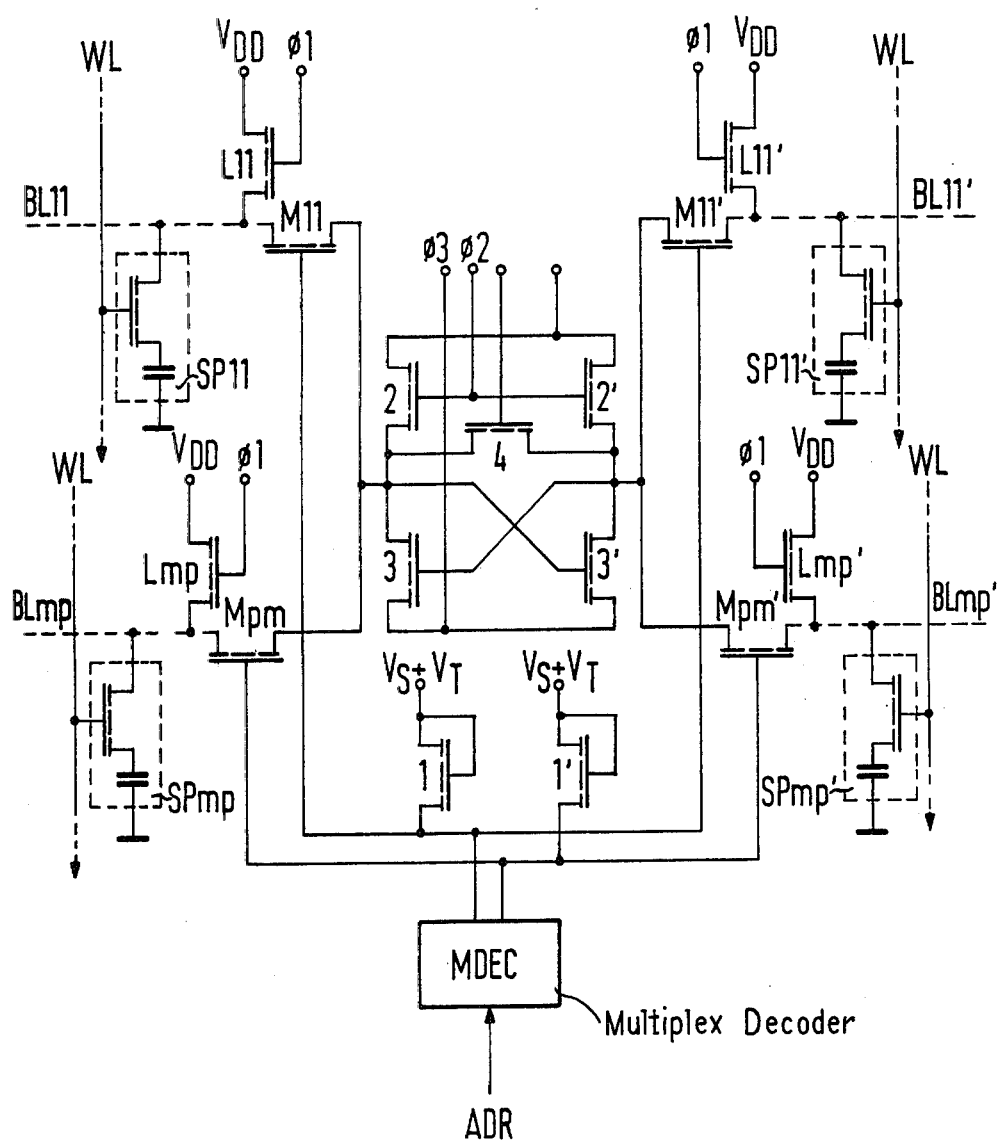
FIG. 2 illustrates an exemplary embodiment of the design of the multiplexer comprising a threshold transistor in each bit line and a pulsed flip-flop as a regenerating amplifier.

As already mentioned, FIG. 2 illustrates an exemplary embodiment of a design of the multiplexer comprising a threshold transistor M11, M11', Mpm, Mpm' in each bit line BL11, BL11', BLpm, BLpm', and a pulsed flip-flop composed of the transistors 2, 2', 3, 3', 4 as a regenerating amplifier. The gates of the threshold transistors M11, M11', Mpm, Mpm' are connected in pairs to control outputs of the multiplex decoder MDEC whose input ADR is supplied with items of address information in accordance with the threshold transistors which are to be operated. The outputs of the multiplex decoder MDEC are also connected to load elements 1, 1' via which the gates of the threshold transistors can be connected to a threshold potential $V_S + V_T$ when they are not in operation. The use of threshold transistors in the manner illustrated in FIG. 2 offers the advantage that in addition to the reduction in surface space for regenerating amplifiers, an optimum transfer of charge from the bit lines to the relevant amplifier input is ensured.

Employing the multiplexer with intermediate storage of information on the bit lines following the activation of a word line would initially appear to involve the disadvantage that with m bit lines to a bit line group, in the read-out process m regenerating cycles would also be required which would result in a relatively long idle time of the store following a first access. This disadvantage can be transformed into an advantage by providing a cache store or memory preferably on the storage chip. This cache memory stores not only the currently required bit or bits, but also all neighboring bits which are affected by the read-out/regeneration cycle. These are then available with a very short access time for the following accesses which, to a high degree of probability, will relate to the next address which in this case would have to be made at the next bit line. Cache principles of this type are already in use in the memory boards of high-speed minicomputers, e.g. "Eclipse".

Accordingly the aforementioned proposed principle can also be applied to memory configurations in which the word length amounts to more than one bit such as, for example, four bits or eight bits. Here the principle easily facilitates serial read-out of the individual bits of a word.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A circuit arrangement for reading out and regenerating items of information stored in one-transistor storage elements, comprising: a plurality of word lines and bit lines; storage element means addressed by the activation of a word line during read-out for transferring an existing information charge into assigned bit lines; said assigned bit lines being connected to influence inputs of assigned read-out/regenerating amplifiers; m bit lines in each case being combined as line groups (1, 2 . . . m; m+1, m+2, . . . 2m; (p−1) m+1, (p−1) m+2 . . . pm); each of said bit line groups being assigned to a multiplexer; individual bit lines of a bit line group being connected to individual inputs of the assigned multiplexer; the assigned multiplexers each being connected by one output to the input of an assigned read-out/regenerating amplifier; a multiplex decoder means for consecutively connecting all the individual bit lines of each bit line group in a predetermined sequence via the relevant multiplexer to the input of the assigned read-out/regenerating amplifier; and, in order to improve the transfer of charge into the bit lines, threshold transistors are connected in pairs by their gates to relevant outputs of the multiplex decoder means, the threshold transistors forming means for switching individual inputs of the multiplexer; and for each output of the multiplex decoder means a load element being provided whose second terminal is in each case connected to a threshold potential.

2. A circuit arrangement for reading out and regenerating items of information stored in one-transistor storage elements, comprising: a plurality of storage elements addressed by a plurality of word lines and bit lines; the bit lines being formed into bit line groups and each bit line group connecting to a multiplexer; each multiplexer connecting to a read-out regenerating amplifier; multiplex decoder means connecting to each of the multiplexers for consecutively connecting each of the bit lines within a given bit line group to its assigned read-out/regenerating amplifier; and, in order to improve the transfer of charge into the bit lines, threshold transistors are connected in pairs by their gates to relevant outputs of the multiplex decoder means, the threshold transistors forming means for switching individual inputs of the multiplexer; and for each output of the multiplex decoder means a load element being provided whose second terminal is in each case connected to a threshold potential.

* * * * *